United States Patent [19]
Fujii

[11] Patent Number: 6,146,797
[45] Date of Patent: Nov. 14, 2000

[54] FOCUSED ION BEAM LITHOGRAPHY METHOD WITH SAMPLE INSPECTION THROUGH OBLIQUE ANGLE TILT

[75] Inventor: Toshiaki Fujii, Chiba, Japan

[73] Assignee: Seiko Instruments Inc., Japan

[21] Appl. No.: 09/204,894

[22] Filed: Dec. 3, 1998

[30] Foreign Application Priority Data

Dec. 4, 1997 [JP] Japan ................................. 9-334657

[51] Int. Cl.⁷ ....................................................... G03F 9/00
[52] U.S. Cl. ............................. 430/30; 430/296; 430/302
[58] Field of Search ............................. 430/30, 296, 302

[56] References Cited

U.S. PATENT DOCUMENTS 5,271,800   12/1993   Koontz et al. ........................... 430/296

*Primary Examiner*—Christopher G. Young
*Attorney, Agent, or Firm*—Adams & Wilks

[57] ABSTRACT

A method for performing a cross-sectional analysis of a sample includes steps of observing a sample surface to locate a region of a sample at which a cross-sectional analysis is to be performed, tilting a sample by a predetermined angle, directing a focused ion beam to the surface of the tilted sample, etching a region of the tilted sample, and observing the sample by analyzing particles emitted during the etching process. The angle of tilt of the sample with respect to the angle of incidence of the focused ion beam can be increased to effectively increase the resolution of the focused ion beam etching process with respect to sub-surface structure of the sample.

26 Claims, 3 Drawing Sheets

FOCUSED ION BEAM LITHOGRAPHY METHOD WITH SAMPLE INSPECTION THROUGH OBLIQUE ANGLE TILT

BACKGROUND OF THE INVENTION

The present invention relates to a method of processing a sample to find a cross section using a focused ion beam instrument.

A known method of finding a cross section of a sample using a focused ion beam instrument is disclosed, for example, in Japanese Patent Laid-Open No. 62-174918. That is, an ion beam is perpendicularly directed to a location on a sample surface where a cross section should be created, thus forming a vertical cross section. The cross section is observed.

One known method for obtaining a cross section which does not use a focused ion beam is to cleave a sample. Another known method not using a focused ion beam is to polish a sample. With either method, the target position to be processed cannot be precisely determined. On the other hand, with the method using a focused ion beam, the target processed position can be precisely determined and processed by combining a microscope function with a lithography function.

However, with the rapid development of more advanced semiconductor fabrication techniques and other techniques, the cross-sectional shape of the sample to be observed becomes increasingly finer. The thinnest laminated structure used in semiconductor devices recently developed is less than 10 nm. Therefore, where a vertical cross section is formed and scanned to observe the exposed surface, it is difficult to make the observation, because the resolution of the observing instrument is approached very closely. Furthermore, where the compositional analysis of the cross-sectional structure is performed, the irradiating energy beam can be focused less sharply than the energy beam of the observing instrument. Accordingly, analysis by the prior art method has become increasingly unfeasible.

SUMMARY OF THE INVENTION

To solve the problem described above, in the present invention, a sample is obliquely etched with an ion beam landing on the sample at a shallow incidence angle. The ion beam is then directed to the exposed sample surface vertically or nearly vertically, and the exposed sample surface is observed.

BRIEF DESCRIPTION OF THE DRAWINGS

FIG. 3 shows states of processing in accordance with the invention.

DETAILED DESCRIPTION OF THE INVENTION

Figure 1:
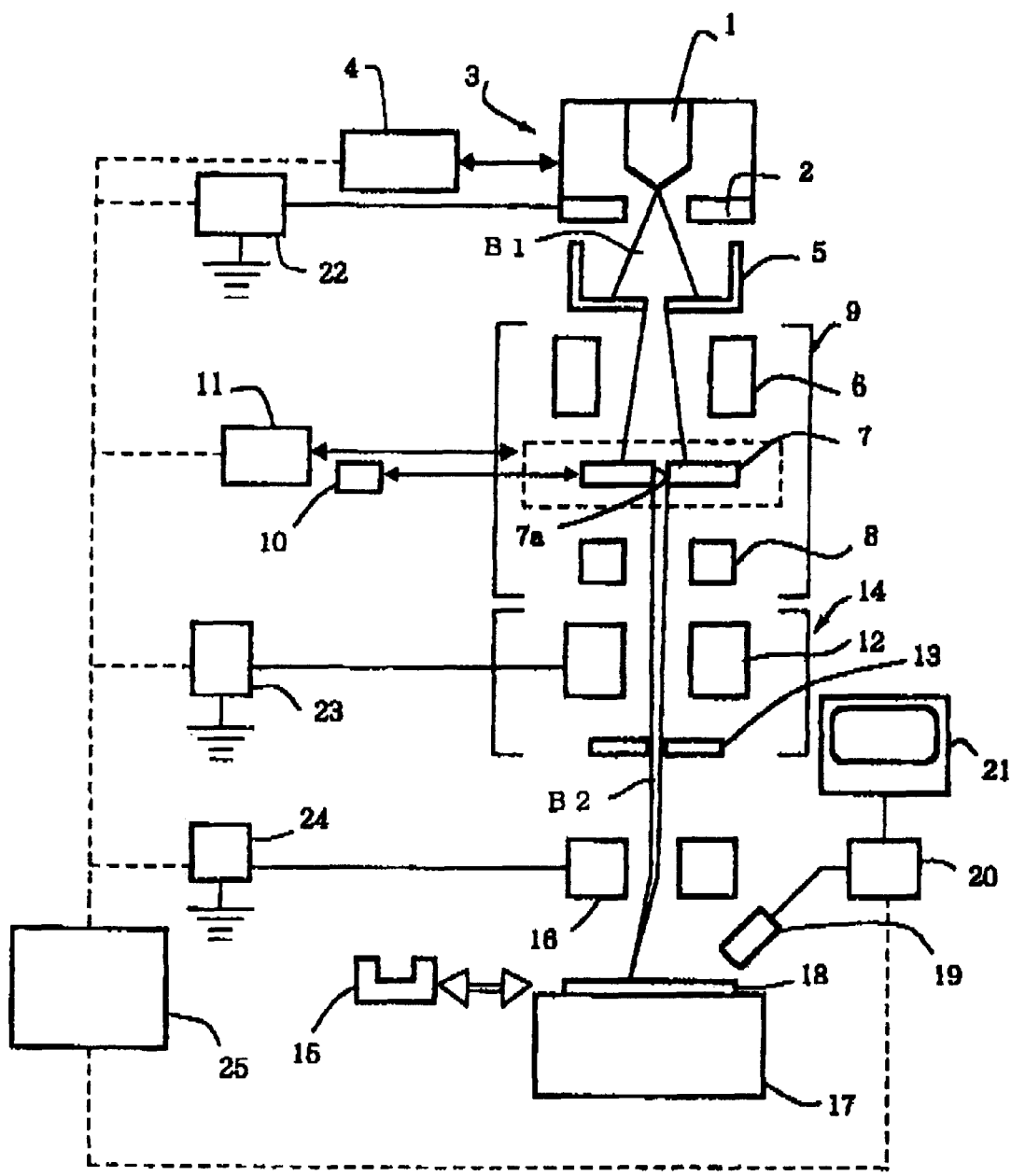
FIG. 1 is a schematic view of a focused ion beam instrument in accordance with the present invention.

First, a focused ion beam instrument according to the present invention will be described with reference to FIG. 1, which schematically shows the configuration of the focused ion beam instrument. As shown in FIG. 1, an ion source portion 3 has a liquid metal ion source 1 as consisting of Ga and an extraction electrode 2. The ion source 3 is carried on an XY translator 4 and is capable of moving in the X- and Y-directions that are perpendicular to the generated beam. The beam-irradiating portion of the ion source 3 has a first aperture member 5 to pass only the central portion of the high-brightness ion beam B1 emitted from the ion source portion 3, the central portion having a high current density.

Located on the beam-exit side of the first aperture member 5 are charged-particle optics 9 consisting of a condenser lens 6, a second aperture member 7, and an objective lens 8. The high-brightness ion beam B1 emitted by the ion source 1 is focused by the charged-particle optics 9 and becomes a focused ion beam B2.

The second aperture member 7 has a plurality of holes 7a having different diameters. The hole which is used to pass the ion beam can be switched by a hole-switching device 10. Note that only one of the holes 7a is shown. That is, the hole in the second aperture member 7 can be switched between holes 7a of different dimensions by the hole-switching device 10. In this example, the holes 7a having different diameters are changed by sliding the second aperture member 7 to change the diameter of the hole 7a. Alternatively, the diametrical dimension of a single hole 7a can be varied continuously or in a stepwise fashion. No limitations are imposed on the structure of the hole-switching device 10. A specific example is cited, for example, in Japanese Patent Laid-Open No. 62-223756.

In the second aperture member 7, the diametrical position of each hole 7a can be moved in the X- and Y-directions by an XY translator 11.

A blanking means 14 comprising a blanking electrode 12 and a blanking aperture member 13 is mounted on the beam-exit side of the charged-particle optics 9 to turn the focused ion beam on and off. In particular, when the focused ion beam B2 is to be turned off, a voltage is applied to the blanking electrode 12 to deflect the focused ion beam B2 so that the blanking aperture member 13 blocks the beam. The arrangement of the blanking electrode 12 and the blanking aperture member 13 is not limited to this. For example, they may be placed above the charged-particle optics 9.

A deflection electrode 16 for scanning the focused ion beam B2 passed through the blanking aperture member 13 up to a desired position is mounted on the beam-exit Side of the blanking aperture member 13. The focused ion beam B2 scanned by the deflection electrode 16 is directed at a desired position on the sample 18 on a sample stage 17. The focused ion beam B2 can be repetitively scanned across a desired region on the surface of the sample 18. The sample stage 17 is provided with an XYZ translation function permitting the sample 18 to be moved in the X, Y, and Z-directions. The sample stage 17 is further provided with a tilting function for tilting the sample 18.

A secondary charged-particle detector 19 is disposed above the sample stage 17 to detect secondary charged particles emitted from the surface of the sample 18 irradiated with the focused ion beam B2. An image control portion 20 for amplifying the detected signal and finding the two-dimensional intensity distribution of the secondary charged particles and an image display unit 21 for displaying a pattern formed on the sample surface according to the two-dimensional intensity distribution signal from the image control portion 20 are connected with the secondary charged-particle detector 19.

A Faraday cup 15 is mounted alongside the sample stage 17 much that their positions can be interchanged. The Faraday cup 15 undergoes the irradiation of the focused ion beam B2 instead of the sample 18 and measures the beam current.

An extraction power supply 22, a blanking power supply 23, and a deflection power supply 24 for applying desired voltages to the extraction electrode 2, the blanking electrode 12, and the deflection electrode 16, respectively, are connected with them. Furthermore, a control portion 25 consisting of a computer system capable of controlling the whole focused ion beam instrument is mounted. The control portion can control the XY translator 4, the hole-switching device 10, the XY translator 11, the power supplies 22–24, etc. separately.

In this focused ion beam instrument, the ion beam B1 extracted from the ion source 3 is focused by the charged-particle optics 9, scanned by the deflection electrode 16, and directed at the sample 18. Thus, the sample 18 can be processed. Although not shown in this example, a gas emission nozzle may be mounted near the sample 18. A gas may be supplied from the gas emission nozzle simultaneously with the irradiation of the focused ion beam B2. In consequence, a CVD-grown film can be formed locally.

During such processing, it can be monitored through the image display unit 21. Although not shown in this example, the surface of the sample 18 may be illuminated with ordinary illumination. At the same time, the sample surface may be observed with an optical microscope.

Figure 2:
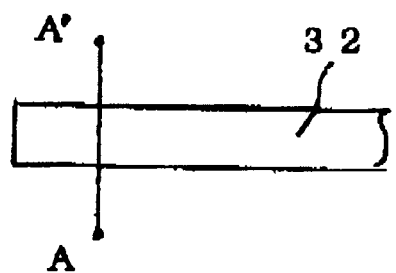
FIG. 2 is an observed image of a sample placed horizontally.

A sample-processing method using such a focused ion beam instrument is hereinafter described. First, a peripheral image for forming a cross section of the sample 18 is found as shown in FIG. 2, which is obtained by illuminating the surface of the sample 18 while scanning it and detecting secondary charged particles emanating from the surface of the sample 18 in response to the irradiation by the secondary charged-particle detector 19.

Figure 3A:
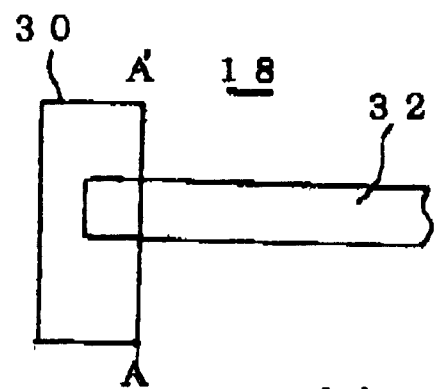
FIG. 3a is a plan view.
Figure 3B:
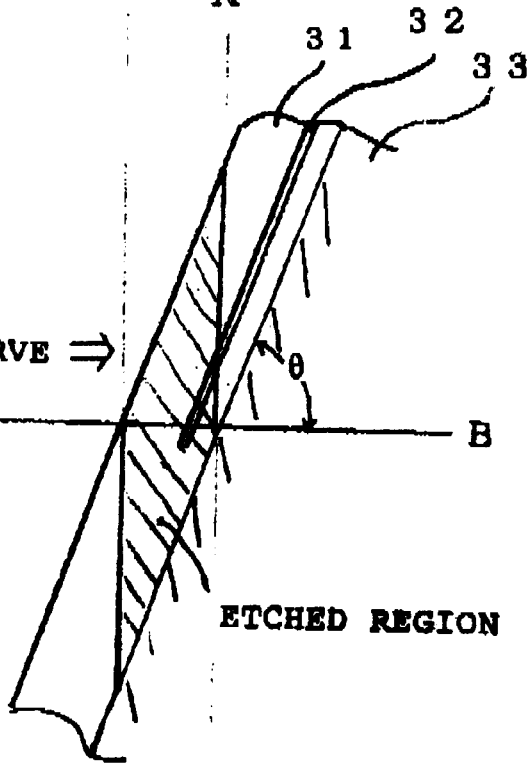
FIG. 3b is a cross-sectional view.

At first, the sample 18 is placed such that its surface is perpendicular to the irradiation axis of the focused ion beam B2. Then, a position on the sample 18 that is to be processed and observed is found. Subsequently, the sample 18 is tilted at an angle of $\theta$ as shown in FIG. 3b, using the tilting function of the sample stage 17. At this time, the position of the sample 18 processed relative to the given optical axis of the focused ion beam B2 shifts. The focused ion beam B2 is again irradiated and scanned. The surface of the sample is observed.

Subsequently, one specifies a portion A–A' of the image having a structure that he or she wants to observe. Then, he roughly specifies a depth d of the structure to be observed. During processing, the incidence angle of the focused ion beam B2 is $\theta$. The region (processed frame 30) illuminated with the ion beam is determined from these relations when the sample is tilted as shown in FIG. 3a. The region of the processed frame 30 is established by the deflection electrode 16 in the region scanned by the focused ion beam B2. The beam is scanned to process the sample. After a given time passes since the start of the processing, the processed surface is observed, and a check is made if a desired location is not found. Accordingly, in the initial phase of the processing, the depth d is set to a shallow value, and then a processed region is determined. The depth d is progressively increased while monitoring the processed shape. In this way, the desired location is found. The cross section of the sample 18 is processed as shown in FIG. 3b. For example, the sample 18 is a semiconductor device comprising a substrate 33 on which a dielectric film 31 is formed. A very thin layer of metallization 32 is formed inside the dielectric film. The observed cross section is the layer of metallization 32. As mentioned previously, the processed cross section of the layer of metallization 32 is increased by a factor of $1/\cos\theta$. If $\theta=80°$, the factor is 5.8. If $\theta=85°$, the factor is 11.5.

After the end of the processing, the ion beam is tilted until it is vertical or almost vertical to the processed surface of the sample. The processed cross section is observed. The compositions of the substances appearing on the processed surface are analyzed. If the tilting function of the sample stage 17 is returned to its original state, the surface of the sample 18 is perpendicular to the optical axis of the focused ion beam B2. It follows that the processed cross-sectional surface is tilted at $90-\theta$ from the horizontal. Where an observation is made vertical to the processed cross section, the sample stage 17 is further tilted at $90-\theta$ by the tilting function of the sample stage 17.

At this time, the processed region may be determined by the aforementioned computer system automatically or interactively.

The etched portion under the line BB' shown in FIG. 3b does not contribute to observation and so it does not need to be etched. Therefore, the amount of unwanted etching can be decreased by progressively widening the frame from a smaller one on the side of AA' with the lapse of time. As a result, the time necessary for the processing can be shortened.

Figure 4:
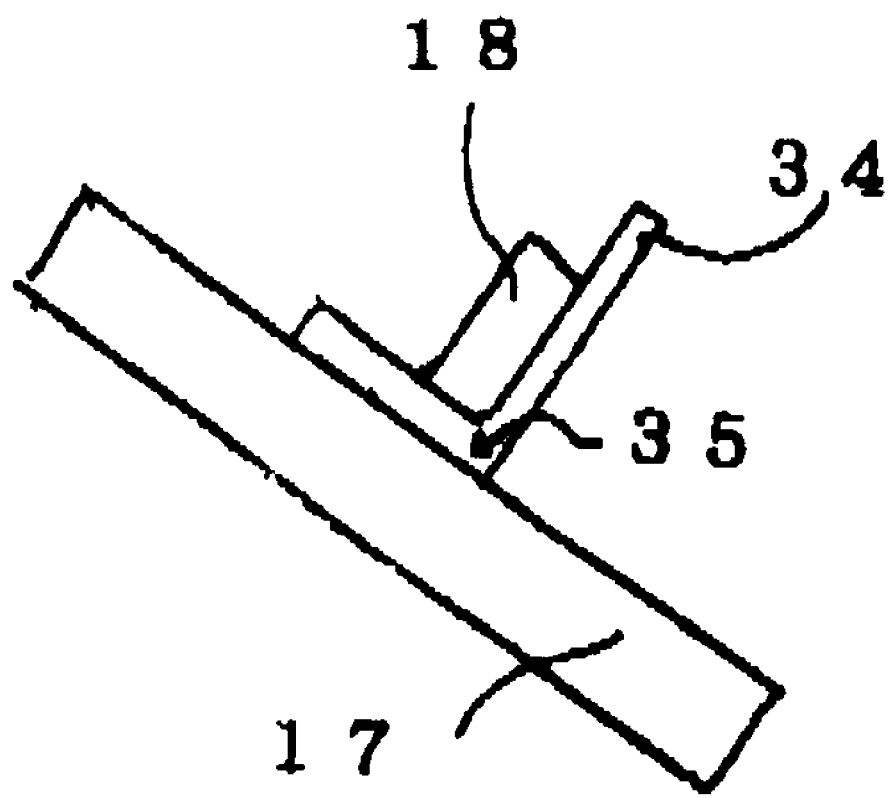
FIG. 4 is a cross-sectional view of another embodiment of the invention.

Generally, as the cross section-enlarging effect of the sample stage becomes more conspicuous, it is more difficult to tilt the sample. Accordingly, the sample is placed on the sample-tilting mechanism 34 shown in FIG. 4. Where a sample-tilting jig 34 having a rotating shaft 35 that can be tilted at will is placed on the sample stage 17, the incidence angle of the focused ion beam B2 with respect to the sample surface can be made very shallow. Instead of the sample stage 17, a sample holder having this sample-tilting mechanism may be placed in the sample chamber, and the sample may be processed with the ion beam.

As described thus far, the invention permits observation or analysis of fine vertical structure that has been difficult to observe or analyze in the past.

What is claimed is:

1. A focused ion beam lithography and observation method in which a sample is processed by directing a focused ion beam to a desired region of the sample and scanned across the desired region to etch a surface of the sample so as to process a cross section of the sample and to observe the cross section, the method comprising the steps of:

processing a desired region of the sample surface by scanning across the sample surface with the focused ion beam while tilting the sample at a first angle with respect to an incidence angle of the focused ion beam, the first angle being an oblique angle; and observing the etched region of the sample while tilting the sample at a second angle.

2. The focused ion beam lithography and observation method of claim 1; further comprising the step of analyzing the observed region of the sample surface.

3. A focused ion beam lithography method for analyzing the vertical cross-sectional structure of a sample, comprising the steps of:

tilting the sample at a desired oblique angle;

directing a focused ion beam to a desired region of the sample to be etched to analyze the vertical cross-sectional structure in the desired region; and repetitively scanning the focused ion beam throughout the desired region to etch the surface of the sample with the desired cross section of the sample to be etched lastly in each scanning.

4. A focused ion beam lithography and observation method according to claim 1; wherein the step of processing a desired region of the sample surface is performed using an ion beam instrument comprising an ion beam source, an ion beam focusing system for focusing the ion beam to produce a focused ion beam and projecting the focused ion beam onto the sample surface, a scanning electrode for controlling the position of the focused ion beam with respect to the sample surface so as to cause the focused ion beam to scan across the desired region of the sample surface, and a sample support for supporting the sample and having a tilting mechanism for tilting the sample with respect to an angle of incidence of the focused ion beam.

5. A focused ion beam lithography and observation method according to claim 1; wherein the step of processing a desired region of the sample surface is conducted using a focused ion beam instrument comprising an ion source, an extraction electrode, a first aperture member for passing only a central portion of the ion beam produced by the ion source, charged particle optics comprising a condenser lens, a second aperture member member, and an objective lens for focusing the ion beam, a scanning electrode for controlling the position of the focused ion beam with respect to the sample surface so as to cause the focused ion beam to scan across the desired region of the sample surface, and a sample support for supporting the sample and having a tilting mechanism for tilting the sample with respect to an angle of incidence of the focused ion beam.

6. A focused ion beam lithography and observation method according to claim 5; wherein the second aperture member has a plurality of holes therethrough, and further comprising a hole switching device allowing one of the plural holes to be placed in the path of the focused ion beam.

7. A focused ion beam lithography and observation method according to claim 5; further comprising blanking means for turning the focused ion beam on or off, the blanking means having a blanking electrode and a blanking aperture member and being disposed on one of a beam exit side of the charged particle optics and a beam entry side of the charged particle optics.

8. A focused ion beam lithography and observation method according to claim 5; further comprising an XYZ actuator for moving the ion source relative to the sample support.

9. A focused ion beam lithography and observation method according to claim 5; further comprising a secondary charged particle detection system disposed proximate the sample for detecting particles emitted by the sample as a result of etching using the focused ion beam, and an image display for displaying an image based upon a charged particle intensity distribution output by the charged particle detection system.

10. A focused ion beam lithography and observation method according to claim 9; wherein the charged particle detection system comprises a charged particle detector and an amplifier for amplifying a charged particle signal and detecting a charged particle intensity distribution.

11. A method for performing a cross-sectional analysis of a sample, comprising the steps of:
observing the sample surface to locate a desired region of the sample surface at which a cross-sectional analysis is to be performed;
tilting the sample by a predetermined oblique angle after the desired region is located;
directing a focused ion beam to the desired region of the surface of the tilted sample so that the focused ion beam has an oblique angle of incidence due to the tilt of the sample;
etching a region of the tilted sample; and
observing the sample by analyzing particles emitted in response to the focused ion beam.

12. A method for performing a cross-sectional analysis of a sample according to claim 11; further comprising the step of increasing the angle of tilt of the sample with respect to the angle of incidence of the focused ion beam to decrease the amount of scanning necessary to uncover a desired sub-surface structure of the sample.

13. A focused ion beam lithography and observation method according to claim 1; wherein the step of processing a desired region of the sample surface is performed using a focused ion beam instrument having an ion beam source for producing an ion beam, a focusing optical system for focusing the ion beam and producing a focused ion beam, a sample stage for supporting the sample in a plane perpendicular to that of the focused ion beam and having a tilting mechanism for tilting the sample at a desired angle with respect to the plane of the focused ion beam so that the focused ion beam may be directed at an oblique angle to etch the sample, and an observation system for detecting the composition of particles etched from the sample.

14. A focused ion beam lithography and observation method according to claim 13; wherein the ion beam source comprises a liquid metal ion source for producing an ion beam, and an extraction electrode for directing the ion beam.

15. A focused ion beam lithography and observation method according to claim 14; wherein the ion source further comprises an X-Y translator, on which the liquid metal ion source is mounted, for moving the ion source in a plane perpendicular to that of the ion beam.

16. A focused ion beam lithography and observation method according to claim 13; wherein the ion beam source includes a first aperture member member having an aperture member therethrough for passing a central portion of the ion beam.

17. A focused ion beam lithography and observation method according to claim 13; wherein the ion beam comprises Gallium.

18. A focused ion beam lithography and observation method according to claim 13; wherein the focusing optical system comprises a condenser lens, a second aperture member member, and an objective lens.

19. A focused ion beam lithography and observation method according to claim 13; wherein the focusing optical system further comprises a second aperture member member having a plurality of individually selectable aperture member holes, and a switching device for displacing the second aperture member member for selecting one of the plural aperture member holes.

20. A focused ion beam lithography and observation method according to claim 13; further comprising blanking means for turning the ion beam on and off and having a blanking electrode and a blanking aperture member on one of a beam exit side and a beam entry side of the focusing optical system.

21. A focused ion beam lithography and observation method according to claim 13; further comprising a deflection electrode for selectively deflecting the focused ion beam with respect to the sample.

22. A focused ion beam lithography and observation method according to claim 13; further comprising a secondary charged particle detector disposed above the sample, an amplifier for amplifying a charged particle signal and detecting a secondary intensity distribution, and an image display.

23. A focused ion beam lithograph and observation method according to claim 13; further comprising a Faraday cup disposed adjacent the sample stage to detect the current of the focused ion beam.

24. A focused ion beam lithography and observation method according to claim 13; further comprising a gas ejection nozzle disposed proximate the sample for emitting a selected gas onto the sample during processing such that a thin film may be grown on the sample using the gas.

25. A focused ion beam lithography and observation method according to claim 1; wherein the region to be scanned is widened as time elapses so as to shorten the processing time.

26. A focused ion beam lithography and observation method according to claim 1; wherein the second angle is a right angle.

\* \* \* \* \*